US008217809B2

(12) United States Patent
Westhues et al.

(10) Patent No.: US 8,217,809 B2
(45) Date of Patent: Jul. 10, 2012

(54) LOW POWER SENSING VIA RESISTIVE SENSOR MATRIX

(75) Inventors: Jonathan Westhues, New York, NY (US); Paul Dietz, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 256 days.

(21) Appl. No.: 12/820,900

(22) Filed: Jun. 22, 2010

(65) Prior Publication Data

US 2011/0309956 A1 Dec. 22, 2011

(51) Int. Cl.
*H03M 11/00* (2006.01)
(52) U.S. Cl. .......................................... 341/22; 341/176
(58) Field of Classification Search ............... 341/22, 341/176, 69, 825
See application file for complete search history.

(56) References Cited

U.S. PATENT DOCUMENTS

| | | | | |
|---|---|---|---|---|
| 3,987,392 | A * | 10/1976 | Kugelmann et al. | 324/96 |
| 4,879,526 | A * | 11/1989 | Botti et al. | 330/295 |
| 5,175,508 | A * | 12/1992 | Gingrich et al. | 330/84 |
| 5,355,503 | A | 10/1994 | Soffel et al. | |
| 6,438,699 | B1 | 8/2002 | Cato et al. | |
| 7,612,690 | B2 | 11/2009 | Wright et al. | |
| 2001/0027530 | A1 | 10/2001 | Yen et al. | |
| 2009/0289908 | A1 | 11/2009 | Chen et al. | |
| 2009/0322701 | A1 | 12/2009 | D'Souza et al. | |
| 2010/0066567 | A1 | 3/2010 | Dietz et al. | |
| 2010/0066572 | A1 | 3/2010 | Dietz et al. | |
| 2010/0134437 | A1 | 6/2010 | Yang et al. | |

FOREIGN PATENT DOCUMENTS

KR  1020090029159 A  3/2009

OTHER PUBLICATIONS

"Designing a USB Keyboard with the Cypress Semiconductor CY7C63413 USB Microcontroller", Retrieved at << http://www.cypress.com/?docID=4707 >>, Oct. 27, 1997, pp. 14.
"Start Now with Small Flash PIC® Microcontrollers", Retrieved at << http://www.semiconductorstore.com/pdf/newsite/microchip/PIC16F54_PB2.pdf >>, pp. 6.
"AVR243: Matrix Keyboard Decoder 8-bit Microcntroller Application Note", Retrieved at << http://www.datasheetarchive.com/datasheet-pdf/025/DSA00435436.html >>, Retrieved Date: Apr. 19, 2010, pp. 3.

(Continued)

*Primary Examiner* — Henry Choe
(74) *Attorney, Agent, or Firm* — Alleman Hall McCoy Russell & Tuttle LLP

(57) ABSTRACT

Embodiments are disclosed that relate to input devices. In one embodiment, an input device comprises a sensor matrix having first and second pluralities of conductors, a plurality of first resistors, a voltage-applying mechanism configured to apply a selected voltage to each second conductor of the plurality of second conductors, a plurality of sensors, a scanning sensing circuit, and a wake-up sensing circuit. Each first resistor is connected in series between a first voltage and a conductor of the plurality of first conductors. Each sensor includes a switch in series with a matrix resistor, and each sensor is connected to one of the plurality of first conductors and one of the plurality of second conductors. The scanning sensing circuit is connected to each of the plurality of first conductors, and the wake-up sensing circuit is connected to each of the plurality of second conductors.

20 Claims, 4 Drawing Sheets

OTHER PUBLICATIONS

"STMPE2401—Port expander keypad controller AN2423", Retrieved at << http://www.datasheetarchive.com/datasheet-pdf/071/DSA00358005.html >>, Apr. 2007, pp. 3.

June, Laura., "Microsoft busts out SideWinder X4 anti-ghosting keyboard", Retrieved at << http://www.engadget.com/2010/02/01/microsoft-busts-out-sidewinder-x4-anti-ghosting-keyboard/ >>, Feb. 1, 2010, pp. 4.

"MF2 Compatible Keyboard with COP8 Microcontrollers", Retrieved at << http://www.national.com/an/AN/AN-734.pdf >>, 1995, pp. 20.

"International Search Report", Mailed Date: Dec. 28, 2011, Application No. PCT/US2011/041017, Filed Date: Jun. 19, 2011, pp. 7.

* cited by examiner

LOW POWER SENSING VIA RESISTIVE SENSOR MATRIX

BACKGROUND

An input device, such as a touch sensor or a keyboard, may include a sensor matrix having a switch for each sensor. In one example, a keyboard may include keys and a sensor matrix with a first set of conductors arranged in rows and a second set of conductors arranged in columns. Each key may include a switch connecting one row and one column when the key is pressed. The pressed key may be identified by scanning the column conductors and sensing the row conductors with a scanning sensing circuit.

SUMMARY

Various embodiments are disclosed herein that relate to sensor matrices and input devices. For example, one disclosed embodiment provides an input device comprising a sensor matrix including a plurality of first conductors, a plurality of second conductors, a plurality of first resistors, and a voltage-applying mechanism configured to apply a selected voltage to each second conductor of the plurality of second conductors. Each first resistor is connected in series between a first voltage and a first conductor corresponding to the first resistor. The sensor matrix further comprises a plurality of sensors, a scanning sensing circuit, and a wake-up sensing circuit. Each sensor includes a switch in series with a matrix resistor, wherein the sensor is connected to a first conductor corresponding to the sensor and a second conductor corresponding to the sensor. The scanning sensing circuit is operatively connected to each conductor of the plurality of first conductors, and the wake-up sensing circuit is operatively connected to each conductor of the plurality of second conductors.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
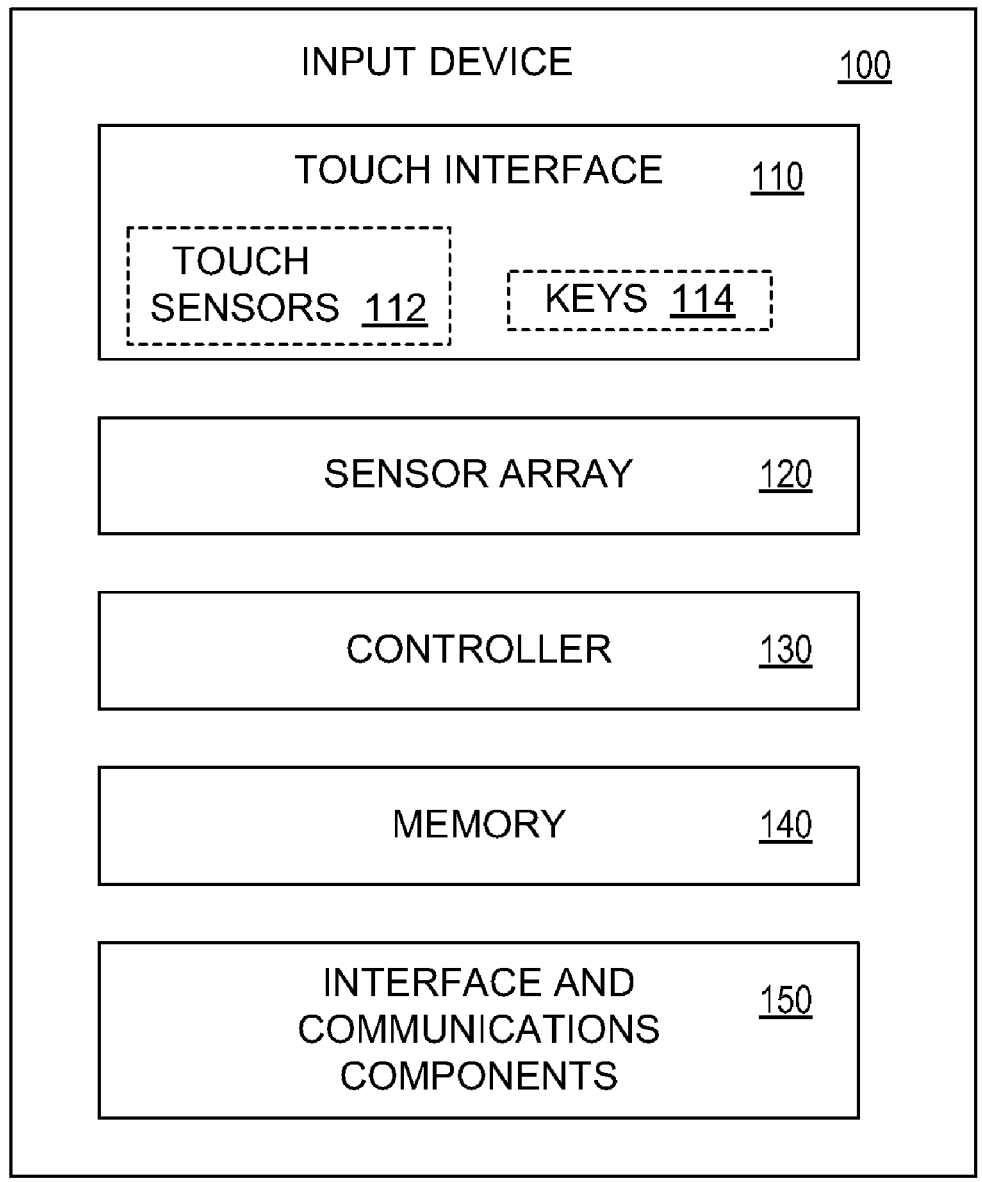
FIG. 1 shows an example embodiment of an input device including a sensor matrix.

Various embodiments are disclosed herein that relate to the low-power sensing of a sensor matrix in an input device. An input device, such as a touch sensor (e.g. a resistive touch screen), a computer keyboard, a musical keyboard, or other such input device comprising a matrix of input coordinates may include a sensor switch at each coordinate that is configured to receive input. The sensors may be connected such that each switch is connected to a conductor from a set of first conductors and a conductor from a set of second conductors different from the set of first conductors. Thus, when one sensor is active, the sensor may be identified by knowing which conductors are connected by the closed switch of the sensor.

When multiple sensors are active, a conventional sensor matrix may not be able to correctly identify the correct active sensors. For example, a keyboard may include rows A and B, columns 1 and 2, and a key at an intersection of each row and column. Each key may be identified by its associated row and column, such that the keys may be labeled A1, A2, B1, and B2. When three of the four keys are pressed (e.g. active), the inactive key cannot be identified because rows A and B and columns 1 and 2 are shorted together by any combination of three or four of the keys being active. This aspect of the conventional keyboard may be referred to as "ghosting" or "phantom keys."

One past solution to this problem is to insert a diode in series with each switch. By doing this, every combination of closed switches creates a unique set of current paths between rows and columns. Thus, any combination of closed switches can be correctly determined. However, the additional diodes may add significant cost. A further complication is that many keyboards use flexible membranes, printed with conductive material, to create the switches and their connections. This technology does not easily allow for the addition of the required diodes.

To address this issue, a sensor matrix may utilize resistors rather than diodes in series with each switch to allow any combination of closed switches to be uniquely determined. Such a configuration is shown herein with reference to FIGS. 2-3, described below. Unlike the diode approach, the resistive matrix uses a current measurement, rather than a voltage measurement to determine switch state. However, a disadvantage of this technique is that the current measurement circuitry requires power to operate, even when the keyboard is sitting idle, waiting for a key press to occur.

Thus, to reduce the power consumption of such circuitry, a useful technique is to enter a low-power sleep mode during periods of inactivity. When using this technique, a mechanism provided for detecting when activity resumes so that sleep mode may be exited. One option would be to use a timer to wake periodically to scan the matrix to see if any activity is occurring. To achieve low power, the sleep times should be as long as possible. However, it is possible that activity could start and stop while sleeping. To catch this activity, the system should wake frequently. Thus, there is a fundamental tradeoff between power and responsiveness.

An alternative technique is to use the "wake-on-change" feature available on many microcontrollers. Using this, the system wakes from sleep when the state of a pin changes. There is no need for periodic scanning, and if configured properly, closing any switch will immediately trigger the transition out of sleep mode. This may allow for both maximum sleep time (minimizing power) and optimal responsiveness.

Therefore, embodiments are disclosed herein that relate to enabling a resistive sensor matrix to wake up a microprocessor on a GPIO edge interrupt when a sensor matrix switch is activated. Prior to discussing these embodiments, an example of a suitable use environment is first described. FIG. 1 illustrates a block diagram of an example embodiment of an input device 100. Non-limiting examples of input devices may include keyboards, resistive touch sensitive devices, and other input devices comprising a resistive sensor matrix. Input device 100 may include a touch interface 110. In one embodiment, touch interface 110 may include a touch sensor 112, such as on a touch sensitive input device. In another embodiment, touch interface 110 may include keys 114, such as on a keyboard input device. Touch interface 110 is connected to a sensor matrix 120, such as a keyboard or touch sensor.

A controller 130 may be configured to execute instructions to carry out methods of scanning and sensing the conductors as well as other functions of input device 100. The instructions may be encoded and stored in a computer readable medium, such as memory 140. Non-limiting examples of controller 130 may include discrete logic gates, a microcontroller, a microprocessor, logic in a programmable logic device or in an application specific integrated circuit (ASIC). Non-limiting examples of memory 140 may include volatile and/or non-volatile memory such as Flash memory, read-only memory, random access memory, and removable storage such as a digital versatile disc (DVD), Flash drive, CD-ROM, or other removable medium. Controller 130, memory 140, and components of sensor matrix 120 may be integrated onto a common device, or provided separately.

Interface and communications components 150 may be used to communicate information between input device 100 and a computer or other device. For example, the identity of a pressed key may be transmitted to a computer through a Universal Serial Bus (USB) interface. Communications may be via a wired or wireless interface, for example. Non-limiting examples of interface and communications components 150 may include interfaces to USB, PS/2, RS-232, Ethernet, IEEE 802.11, or other suitable interfaces. Interface and communications components 150 may be integrated with controller 130, memory 140, and components of sensor matrix 120 in a common device.

Figure 2:
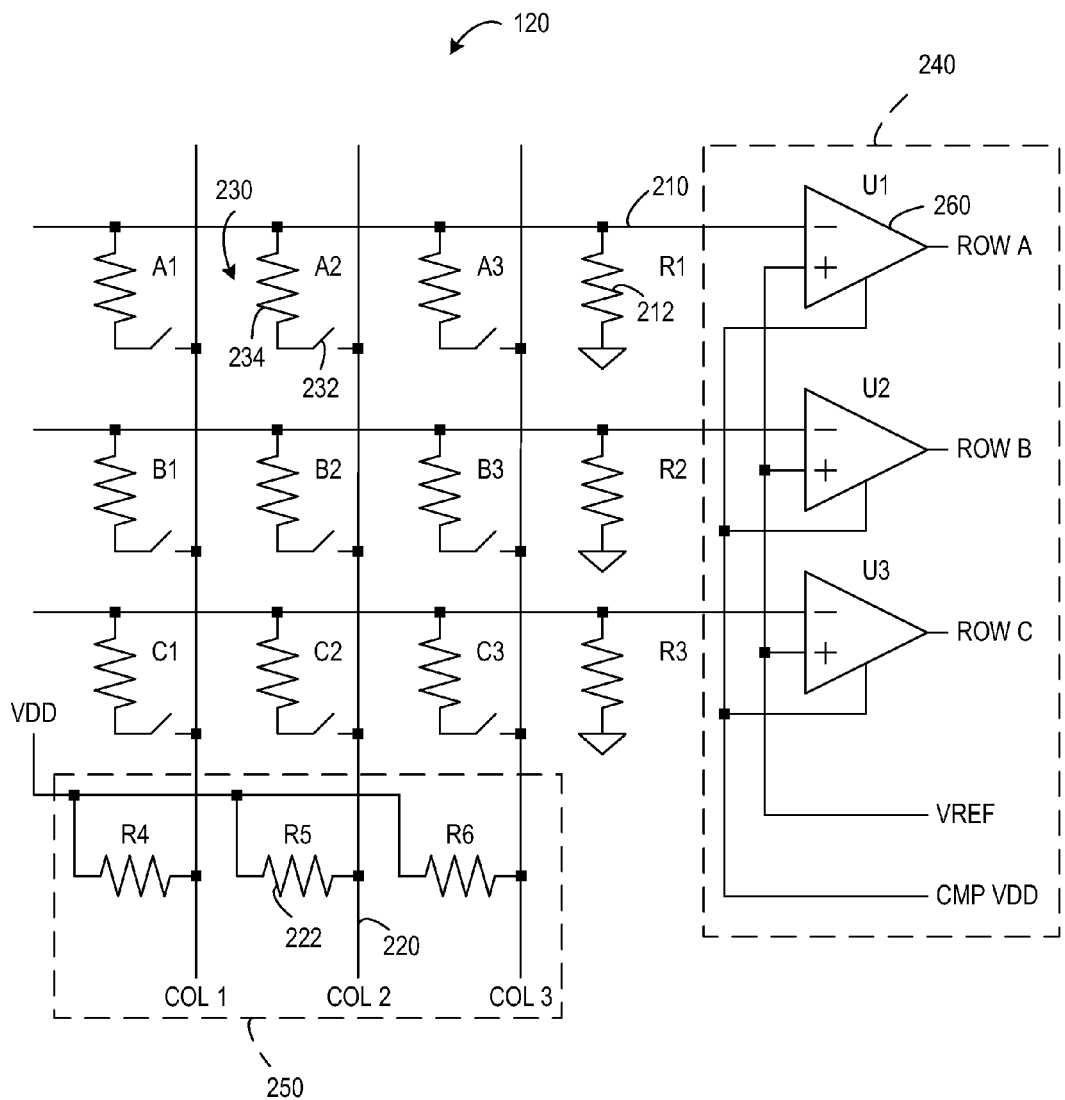
FIG. 2 shows an example embodiment of a sensor matrix including a wake-up sensing circuit and a scanning sensing circuit.

FIG. 2 illustrates a schematic of an example embodiment of sensor matrix 120 configured to wake from a sleep state upon activation of a sensor matrix switch. Sensor matrix 120 comprises a plurality of first conductors including conductor 210, a plurality of second conductors including conductor 220, a plurality of first resistors including resistor 212, and a plurality of second resistors including resistor 222. While the plurality of first conductors extends horizontally and the plurality of second conductors extends vertically in the schematic of FIG. 2, it will be appreciated that the orientation of the plurality of conductors in the schematic is shown for the purpose of illustration, and is not intended to imply any particular physical arrangement of first and second pluralities of conductors.

Each first resistor 212, which may be referred to herein as a "pull-down" resistor, is connected in series between a first voltage Vss and a first conductor corresponding to the first resistor. Each second resistor 222, which may be referred to herein as a "pull-up" resistor, is connected in series between a second voltage Vdd and a second conductor corresponding to the second resistor. The first resistors 212 and second resistors 222 may have any suitable configuration. In one embodiment, resistors 212 and 222 may be screen printed with a resistive ink, such as a carbon ink. In alternative embodiments, resistors 212 and 222 may be surface mount, axial lead resistors, or any other suitable type of resistor. In yet another embodiment, one or more of resistors 212 and 222 may be integrated in an integrated circuit including a microcontroller. For example, controller 130 may include programmable input/output pins with programmable pull-up and/or pull-down resistors. The resistor values are chosen such that the pull-down resistors are suitably smaller in resistance than the sensor resistors, which are in turn suitably smaller in resistance than the pull-up resistors.

Sensor matrix 120 further comprises a plurality of sensors 230, a scanning sensing circuit 240, and a wake-up sensing circuit 250. Different sensors are noted as A1-A3, B1-B3, and C1-C3 in FIG. 2, where each sensor represents a keyboard key, touch input location, or the like. Each sensor 230 includes a switch 234 in series with a matrix resistor 232, and the sensor 230 is connected to a corresponding first conductor 210 corresponding to the sensor and a second conductor 220 corresponding to the sensor.

Scanning sensing circuit 240 is operatively connected to each first conductor of the plurality of first conductors. In the depicted embodiment scanning sensing circuit 240 includes a plurality of comparators 260. Each comparator 260 includes an input connected to a first conductor from the plurality of first conductors, an output connected to controller 130 (where the labels "ROW A," "ROW B," and "ROW C" are shown), and another input connected to a reference voltage 262. Likewise, each second conductor is connected to controller 130 where the labels "COL 1," "COL 2," and "COL 3" are shown. In another embodiment, scanning sensing circuit 240 may include an analog to digital converter (ADC), such that the integrated ADC may be used for sampling an output of each first conductor. In other embodiments, any other suitable scanning circuit may be used.

During scanning, controller 130 scans the sensor matrix by driving a selected second conductor of the plurality of second conductors high while leaving the others low. The pull-down resistors 212 are designed to sense the row current by slightly changing the voltage on the rows proportional to the current. To first order, one can think of the row voltages as fixed at approximately ground. Since all of the columns are also low, except the driven one, the only resistors that can have substantial voltage across them are the ones attached to the driven column. Thus, the current in each pull-down resistor depends almost exclusively on the current provided by the corresponding sensor bridging to the driven column. Comparators (260) are used to sense the small voltage rise that will occur if the sensor switch is closed. The controller reads the output of each comparator to detect whether any sensor switches are closed. While the depicted embodiment is configured to be read by driving the columns and scanning the rows, it will be understood that the depicted sensor matrix may be configured to be ready by driving the rows and scanning the columns.

During sleep mode, comparators 260 may be switched off. This may allow the current used by the input device to remain below a desired threshold, such as a USB suspend current specification (e.g. 500 microamps), during sleep mode. This may help to meet the specifications of standards such as USB, and/or also may allow for improved battery life in battery-powered input devices.

However, when the comparators 260 are switched off, the controller 130 is not able to scan the sensor matrix by looking at the output of the comparators 260. Therefore, wake-up sensing circuit 250 may be used to monitor the plurality of second conductors to determine when a sensor may have been activated. This may be performed as follows. During sleep mode, the controller 130 configures all of the columns, which are driven as outputs during normal input device wake mode operation, to be digital inputs. The controller 130 then powers down the comparators 260 (or other scanning sensing circuitry) to enter sleep mode. If no sensor switches 232 are closed, then all of the second conductors 220 are pulled high by the second resistors 222. Controller 130 is configured to wake up on any falling edge voltage on any of second conductors 220, and then goes to sleep. Because comparator power is disconnected on the high side leaving only a connection to ground, the comparator 260 will not drive the corresponding row to any voltage other than ground, independent of the design of the particular comparator used.

As long as a user does not actuate any sensor, the pull-up resistors (second resistors 222) hold the second conductors 220 high. The controller 130 will therefore remain in sleep. On the other hand, when a user actuates a sensor (e.g. by pressing a keyboard key or touching a resistive touch sensor), a voltage divider is formed. For example, if a user activates the sensor at position A1, resister R4 of the plurality of second resistors is pulling up, while the series resistors R1 (of the plurality of first resistors) and RA1 (i.e. the matrix resistor at position A1) are pulling down. Use of a sufficiently large resistor for resistor R4 of the plurality of second resistors allows the resulting voltage of the second conductor 222 to be detected as a logic low by the controller 130. Thus, the activation of the sensor at position A1 is detected as a falling edge by controller 130, which causes the controller to enter the wake mode and power up the comparators 260 (or other scanning circuitry). Then, controller 130 scans the sensor matrix to determine which sensor is activated. In this manner, each switch is actuatable to form a voltage divider comprising one second resistor of the plurality of second resistors, the matrix resistor that is in series with the switch, and one first resistor of the plurality of first resistors. This allows the wake-up sensing circuit to be triggered to wake up the controller by detecting a voltage edge on any conductor of the plurality of second conductors.

The comparators 260 may be switched off in any suitable manner. For example, the Vdd terminal of the comparators 260 may be connected to a GPIO pin of controller 130 (which is driven high to turn the comparators 260 on, or driven low to turn the comparators 260 off), by using a discrete power transistor or other switch, or in any other suitable manner.

Likewise, each of the resistors may have any suitable values. For example, in one specific example embodiment, resistor R1 has a value of approximately 1 kohm, resistor RA1 has a value of approximately 20 kohm, and resistor R4 has a value of approximately 1000 kohm, the voltage divider produces an output of approximately (21 kohm/1021 kohm)=approximately 0.02 times Vdd. It will be understood that these specific resistor values are presented for the purpose of example and are not intended to be limiting in any manner, and that the resistors may have any other suitable values. Suitable values for second resistors 222 may include, for example, values that are sufficiently different from the values of the matrix resistors to produce a voltage less than that recognized by the controller 130 to correspond to a low logic level. In some embodiments, the matrix resistors 232 may have values that are significantly larger than the first resistors 212 (e.g. on a different order of magnitude). In other embodiments, the matrix resistors 232 may have values that are close to or even equal to the first resistors 212, as long as the sum of the matrix resistor 232 and first resistor 212 along any conductive pathway formed via a switch actuation is sufficiently small compared to the value of the second resistor 222 along that conductive pathway for the wake-up sensing circuit to operate as discussed above. Because current is lost through any additional closed switches along a same first conductor 210, a threshold value of the first resistor 212 may be selected based upon a worst-case scenario of all switches along that first conductor 210 being closed simultaneously.

Likewise, suitable resistor values also may in some embodiments be selected based upon noise considerations. Due to the relatively high resistances of each second resistor 222 compared to each matrix resistor 232, noise currents may produce a false low level on one of second conductors 220. Thus, it may be possible that controller 130 may wake up upon observing spurious falling edges, electrostatic discharge events, radiated electromagnetic compatibility effects, and/or other similar effects. However, because controller 130 merely scans the sensor matrix with the comparators 260 powered up upon waking up, no false keystrokes will be detected. Thus, such noise may cause only a slightly increased current due to the comparators being powered up. It will be understood that, where the matrix resistors are formed via printing with silver or carbon ink or the like, resistances of the matrix resistors and/or the second resistors may be determined by the properties of the ink, and that decreasing the resistance of the matrix resistors by printing thicker or fatter traces may increase the cost of the sensor matrix due to the greater volume of ink used.

The embodiment of FIG. 2 may allow a significant reduction in power consumption compared to sensor matrices in which comparators 260 are left powered up to detect sensor activation while controller 130 is asleep. For example, the power consumption of the embodiment of FIG. 2 during sleep is substantially equal to the power consumption of a conventional keyboard during sleep. Further, it will further be understood that the wake-up sensing circuitry may perform correctly no matter how the scanning circuitry (comparators or other) behaves when powered off. For example, when powered down, comparators 260 may sink more power to ground. This may help to increase the resistance pulling down and decrease the voltage relative to when the comparators 260 are powered on, thereby improving the noise margin and enhancing logic low.

It will be understood that the use of the first resistor 212, second resistor 222, and matrix resistor 234 may be applied to any suitable circuit used for scanning a sensor matrix, including, but not limited to, circuits that utilize op-amp transimpedance amplifiers, discrete transistor amplifiers, a microcontroller's ADC, and/or any other suitable scanning circuitry. In some embodiments, the plurality of second resistors 222 may be omitted. In such embodiments, the controller 130 may be configured to output logic high on each second conductor 220, and then to convert the GPIO pins connected to second conductors 220 to be inputs. In this case, the stray capacitance of the GPIO pin and associated circuitry may hold the corresponding second conductor 220 high until a sensor activation pulls the second conductor 220 low. It will be understood that any suitable voltage-applying mechanism may be used to apply a logic high voltage to each second conductor of the plurality of second conductors, including but not limited to second resistors 222 and controller 130.

Figure 3:
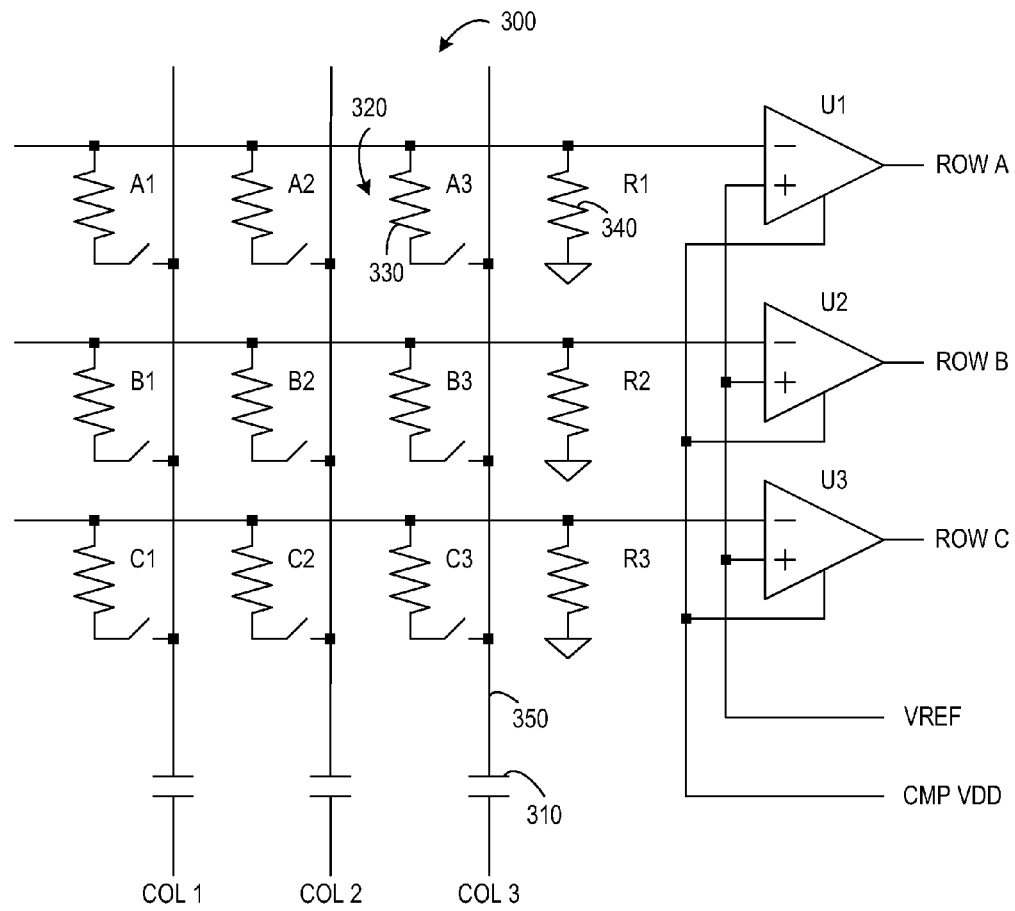
FIG. 3 shows another example embodiment of a sensor matrix including a wake-up sensing circuit and a scanning sensing circuit.

FIG. 3 illustrates an example embodiment of a sensor matrix 300 comprising a wake-up sensing circuit in which controller 130 is utilized to set and maintain a voltage of each second conductor via GPIO pins and associated stray capacitance, and/or via external capacitors, wherein such capacitance is illustrated schematically via capacitors 310. In this embodiment, when entering sleep mode, a voltage, such as $V_{DD}$, may be applied to each of the plurality of second conductors until the plurality of capacitors is pre-charged to $V_{DD}$ or near $V_{DD}$. If no sensors are active, each of the capacitors 310 may stay charged near $V_{DD}$. Alternatively, each of the capacitors 310 may have a parasitic resistance that slowly bleeds charge from each of the capacitors. Thus, controller 130 (which is connected to sensor matrix 300 at the labels "COL 1," COL 2," and COL 3," and at "ROW A," ROW B,", and ROW C") may wake periodically to refresh the charge on each capacitor 310, and then power-down to re-enter sleep mode. If a sensor is active, its associated capacitor 310 may be discharged through the resistor of the sensor and the resistor connected between the associated conductor of the plurality of first conductors and the voltage rail, such as $V_{SS}$. For example, when sensor matrix 300 is in sleep mode, each capacitor 310 may be charged to $V_{DD}$. If sensor 320 is activated (e.g. switch 332 is closed), capacitor 310 may be discharged through resistors 330 and 340. Discharging of capacitor 310 may generate a falling edge on conductor 350 which may be detected by controller 130 so that controller 130 may enter wake mode. Utilizing either of the embodiments of FIGS. 2-3, compared to waking from a timer to do periodic scanning, waking upon occurrence of activity prevents such activity from being missed, thereby allowing for long sleep times.

Figure 4:
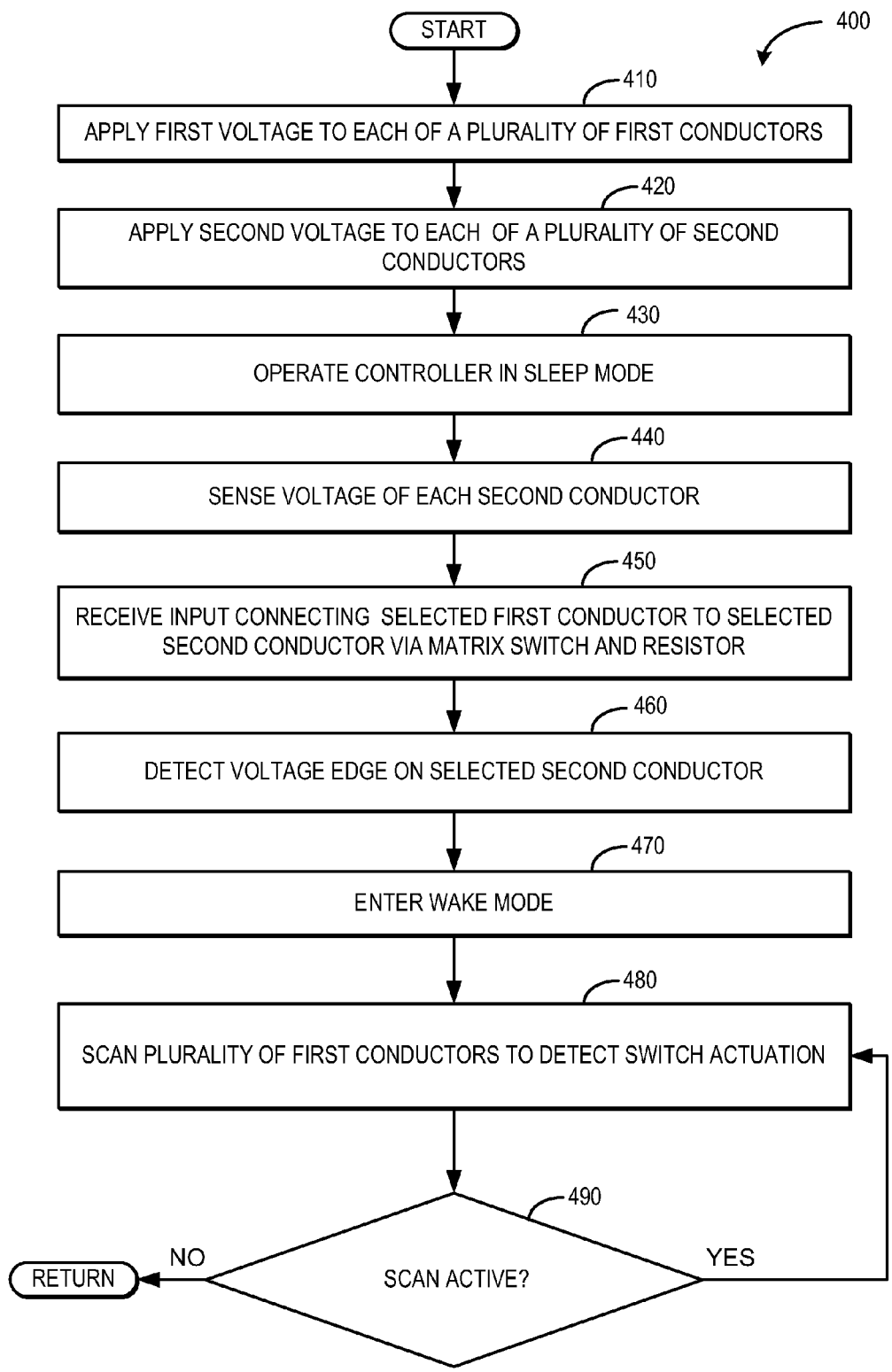
FIG. 4 shows an example embodiment of a method of operating an input device.

FIG. 4 illustrates an example embodiment of a method 400 for detecting an active sensor of an input device, such as input device 100. It is understood that the processes shown in FIG. 4 are representative presented for the purpose of illustration, and not intended to be limiting. For example, in various embodiments the illustrated processes may be performed in a different order than that shown. Further, in various embodiments, one or more of the illustrated processes may be omitted, and/or other processes not shown may be added.

At 410, a first voltage, such as $V_{SS}$, may be applied to each conductor of the plurality of first conductors. In one embodiment, the voltage may be applied through a pull-down resistor, such as resistor 212.

At 420, a second voltage, such as $V_{DD}$, may be applied to each conductor of the plurality of second conductors. In one embodiment, the voltage may be applied through a pull-up resistor, such as resistor 222. In another embodiment, the voltage may be applied by a charged capacitor, such as capacitor 310 charged by controller 130, or in any other suitable manner.

At 430, controller 130 is operated in a sleep mode. Other components may also be placed in a reduced power mode, such as scanning sensing circuit 240. In this manner, the supply current of input device 100 may be reduced during some conditions.

At 440, a voltage of each conductor of the plurality of second conductors may be sensed. In one embodiment, the voltage may be sensed by edge detection logic of an interrupt controller. In another embodiment, the voltage may be sensed by a channel of an ADC, or in any other suitable manner.

At 450, a user actuation of a switch is received, in which a first selected conductor from the plurality of first conductors is connected to a second selected conductor from the plurality of second conductors via the closing of a switch (e.g. by a user depressing a key or pressing on a touch screen). Thus, conductor 220 may be connected to conductor 210 through resistor 232.

At 460, an edge of the voltage of the second selected conductor from the plurality of second conductors is detected. In one embodiment, a falling edge may be detected on a conductor, such as conductor 220. The falling edge may, for example, be defined as a transition from $V_{DD}$ to $V_{SS}$, as a transition from $V_{IH}$ to $V_{IL}$, or in any other suitable manner. It will be understood that, in other embodiments, a rising edge may be detected.

At 470, the controller may enter and operate in a wake mode when the edge of the voltage of the second selected conductor from the plurality of second conductors is detected. Additional components of input device 100 may be operated in a wake mode when the edge of the voltage of the second selected conductor from the plurality of second conductors is detected. For example, current may be supplied to scanning sensing circuit 240 during the wake mode.

Upon entering wake mode, at 480, a sensor matrix scan may be performed to detect a location of a user input, such as the location of a selected key that is pressed by a user. Next, at 490, it is determined if the scanning is still active. For example, in some embodiments, the scanning mode may be active until a predetermined amount of time passes without detecting a switch actuation. If the scanning is still active, method 400 returns to 480 to conduct another scan. On the other hand, if scanning is no longer active, then method 400 returns to 410 to again prepare for and enter sleep mode.

In this manner, an input device may be operated in a manner configured to lessen power consumption yet wake to detect user inputs. The input device may use less supply current during sleep mode which may extend battery life and/or comply with a USB maximum standby supply current standard. A transition from sleeping to waking may be triggered by an active sensor which may further reduce power consumption compared to an input device that periodically wakes up. In addition, waking on an active sensor may reduce or eliminate missed key presses compared to waking periodically, since a key may be pressed and released during a periodic sleep interval. Further, it will be understood that the disclosed sensing and wake-up circuitry may be constructed using off-the-shelf components and microcontrollers of the type intended for use in conventional input devices.

It is to be understood that the configurations and/or approaches described herein are exemplary in nature, and that these specific embodiments or examples are not to be considered in a limiting sense, because numerous variations are possible. The specific methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. An input device comprising a sensor matrix, the sensor matrix comprising:
   a plurality of first conductors;
   a plurality of first resistors, each first resistor being connected in series between a first voltage and a first conductor corresponding to the first resistor;
   a plurality of second conductors;
   a voltage-applying mechanism configured to apply a selected voltage to each second conductor of the plurality of second conductors;
   a plurality of sensors, each sensor including a switch in series with a matrix resistor, each sensor connected to a first conductor corresponding to the sensor and a second conductor corresponding to the sensor;
   a scanning sensing circuit operatively connected to each first conductor of the plurality of first conductors;
   a wake-up sensing circuit operatively connected to each second conductor of the plurality of second conductors.

2. The input device of claim 1, wherein the voltage-applying mechanism comprises a plurality of second resistors, each second resistor being connected in series between a second voltage and a second conductor corresponding to the second resistor.

3. The input device of claim 2, wherein a resistance of each second resistor is lower than a resistance of each matrix resistor.

4. The input device of claim 2, wherein each switch is actuatable to form a voltage divider comprising one second resistor of the plurality of second resistors, the matrix resistor that is in series with the switch, and one first resistor of the plurality of first resistors, and wherein the wake-up sensing circuit is configured to detect a voltage of each conductor of the plurality of second conductors.

5. The input device of claim 1, wherein the wake-up sensing circuit is configured to detect a voltage of each conductor of the plurality of second conductors.

6. The input device of claim 1, wherein the voltage-applying mechanism comprises a controller configured to apply a voltage to each second conductor and also comprises a capacitor, and wherein the controller is configured to receive an input of one or more of a rising edge and a falling edge at each second conductor after applying the voltage to each second conductor.

7. A method for detecting an active sensor on an input device via a controller, the method comprising:
applying a first voltage to each conductor of a plurality of first conductors;
applying a second voltage to each conductor of a second plurality of conductors when the controller is in the sleep mode;
entering the controller in a sleep mode;
sensing a voltage of each conductor of the plurality of second conductors while in the sleep mode;
receiving a user actuation of a switch in series with a matrix resistor, the switch and the matrix resistor connected in series between a first selected conductor from the plurality of first conductors and a second selected conductor from the plurality of second conductors;
detecting via the controller an edge of the voltage of the second selected conductor from the plurality of second conductors; and
entering the controller into a wake mode when the edge of the voltage of the second selected conductor from the plurality of second conductors is detected.

8. The method of claim 7, further comprising:
upon operating the controller in the wake mode, scanning each conductor from the plurality of second conductors, wherein scanning includes applying the second voltage to a selected conductor from the plurality of second conductors and applying the first voltage to the non-selected conductors of the plurality of second conductors; and
sensing a current of each conductor of the plurality of first conductors.

9. The method of claim 7, wherein applying the second voltage to each conductor of the plurality of second conductors includes pre-charging each conductor of the plurality of second conductors by applying the second voltage.

10. The method of claim 7, wherein the first voltage is applied to each conductor of the plurality of first conductors through a first resistor in series with the first voltage, the second voltage is applied to each conductor of the plurality of second conductors through a second resistor in series with the second voltage, and a resistance of the second resistor is greater than a resistance of the first resistor.

11. The method of claim 7, wherein the second voltage is applied to each conductor of the plurality of second conductors via an input/output pin of the controller prior to operating the controller in sleep mode, and further comprising, prior to operating in sleep mode, converting the pin of the controller from an output pin to an input pin after applying the second voltage to each conductor of the plurality of second conductors.

12. The method of claim 11, further comprising periodically waking the controller from sleep mode to refresh the charge on each conductor of the plurality of second conductors and then re-entering into sleep mode.

13. The method of claim 7, further comprising:
supplying current to a scanning sensing circuit during the wake mode; and
disconnecting current to the scanning sensing circuit during the sleep mode.

14. A system for detecting a key pressed on a keyboard, comprising:
a plurality of first conductors and a plurality of first resistors, each conductor of the plurality of first conductors connected by a corresponding resistor of the plurality of first resistors to a first voltage;
a plurality of second conductors and a plurality of second resistors, each conductor of the plurality of second conductors connected by a corresponding resistor of the plurality of second resistors to a second voltage;
a plurality of keys, each key including a switch in series with a matrix resistor, each key connected to a first conductor corresponding to the switch and a second conductor corresponding to the switch;
a scanning sensing circuit including a plurality of inputs connected to the plurality of first conductors;
a wake-up sensing circuit including a plurality of inputs connected to the plurality of second conductors;
a controller operatively connected to the scanning sensing circuit and the wake-up sensing circuit; and
a computer readable medium containing instructions encoded to execute on the controller, the instructions configured to:
put the controller in a sleep mode;
detect an edge of the voltage of each conductor of the plurality of second conductors;
put the controller in a wake mode when the edge of the voltage of a conductor of the plurality of second conductors is detected; and
detect a selected key that is pressed.

15. The system of claim 14, wherein the plurality of second conductors are connected to input/output pins of the controller.

16. The system of claim 14, wherein a resistance of each resistor of the plurality of second resistors is greater than a resistance of each resistor of the plurality of first resistors.

17. The system of claim 14, wherein one or more resistors of the plurality of first resistors and the plurality of second resistors are integrated into one or more input/output pins of the controller.

18. The system of claim 14, wherein the wake-up sensing circuit is integrated into the controller.

19. The system of claim 14, wherein the scanning sensing circuit includes a plurality of comparators, each comparator including a first input connected to one first conductor of the plurality of first conductors and a second input connected to a reference voltage.

20. The system of claim 14, wherein power for the scanning sensing circuit is controlled by an output pin of the controller and the computer readable medium further includes instructions configured to power down the scanning sensing circuit when the system enters the sleep mode and to power up the scanning sensing circuit when the system enters the wake mode.

* * * * *